(12) United States Patent
Wu et al.

(10) Patent No.: US 8,476,156 B1
(45) Date of Patent: Jul. 2, 2013

(54) MANUFACTURING METHOD OF FLASH MEMORY STRUCTURE WITH STRESS AREA

(75) Inventors: Yider Wu, Chu-Pei (TW); Hung-Wei Chen, Chu-Pei (TW)

(73) Assignee: Eon Silicon Solution Inc. (TW)

( * ) Notice: Subject to any disclaimer, the term of this patent is extended or adjusted under 35 U.S.C. 154(b) by 0 days.

(21) Appl. No.: 13/338,405

(22) Filed: Dec. 28, 2011

(51) Int. Cl.
*H01L 21/3205* (2006.01)
*H01L 21/4763* (2006.01)

(52) U.S. Cl.
USPC ............................................ 438/594; 438/264

(58) Field of Classification Search
USPC .......................................... 438/264, 593, 594
See application file for complete search history.

(56) References Cited

U.S. PATENT DOCUMENTS

| | | | |
|---|---|---|---|
| 5,607,879 A * | 3/1997 | Wuu et al. | 438/303 |
| 2009/0004795 A1* | 1/2009 | Lim | 438/261 |
| 2009/0032844 A1* | 2/2009 | Ogura et al. | 257/190 |
| 2009/0294986 A1* | 12/2009 | Yan et al. | 257/774 |

* cited by examiner

*Primary Examiner* — Zandra Smith
*Assistant Examiner* — Pamela E Perkins
(74) *Attorney, Agent, or Firm* — Schmeiser, Olsen & Watts LLP

(57) ABSTRACT

In a manufacturing method of a flash memory structure with a stress area, a better stress effect can be achieved by controlling the manufacturing process of a tunneling oxide layer formed in a gate structure and contacted with a silicon substrate, so that an L-shaped spacer (or a first stress area) and a contact etch stop layer (or a second stress area) of each L-shaped spacer are formed between two gate structures and aligned towards each other to enhance the carrier mobility of the gate structure, so as to achieve the effects of improving a read current, obtaining the required read current by using a lower read voltage, reducing the possibility of having a stress-induced leakage current, and enhancing the data preservation of the flash memory.

7 Claims, 2 Drawing Sheets

MANUFACTURING METHOD OF FLASH MEMORY STRUCTURE WITH STRESS AREA

FIELD OF TECHNOLOGY

Figure 1:
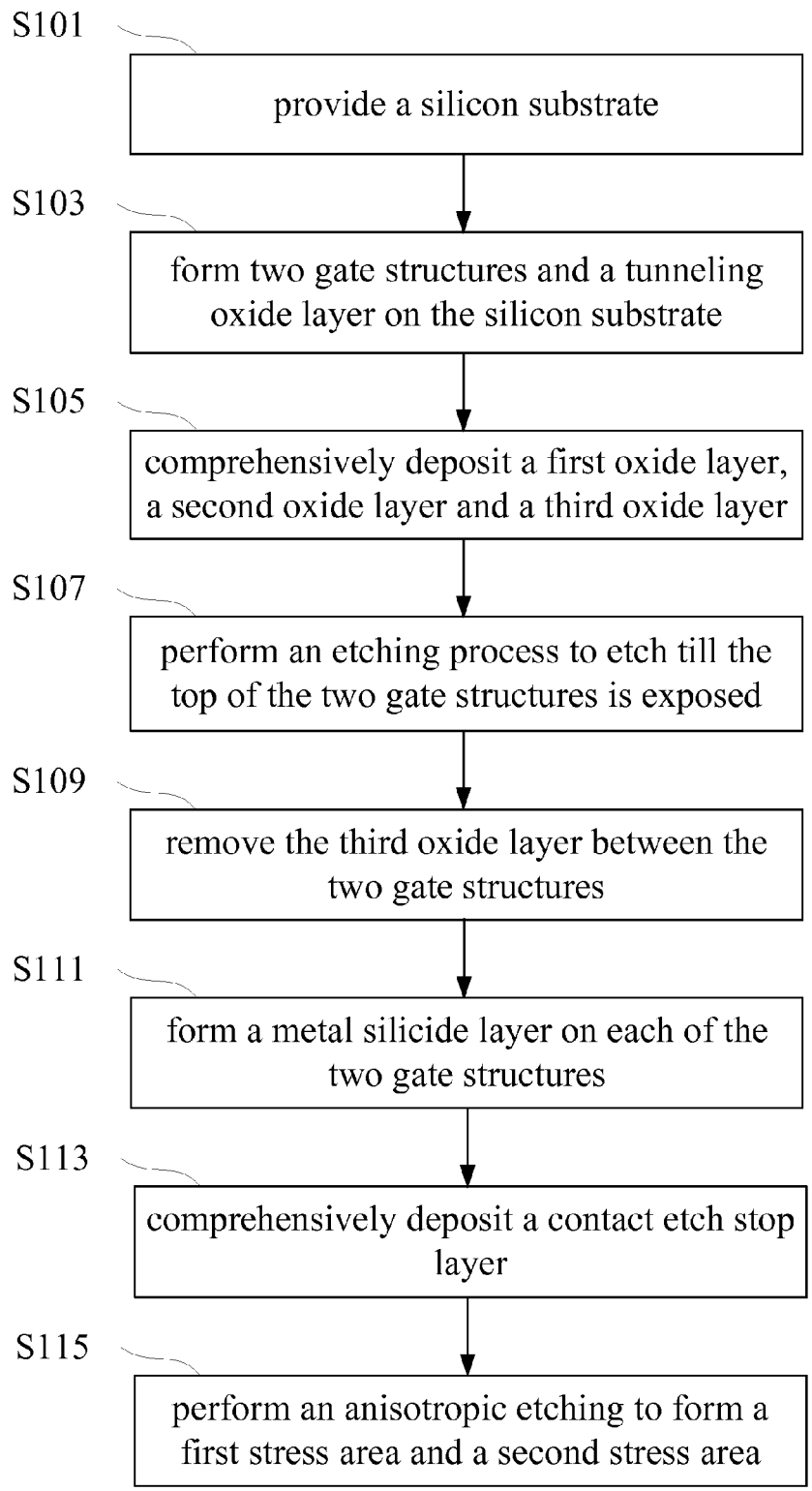

The present invention relates to a semiconductor manufacturing method, in particular to a manufacturing method of a flash memory structure with a stress area.

BACKGROUND

As semiconductor technologies advance, the manufacturing process of the flash memory also enters into the nano era. To expedite the operation of devices, increase the density of devices, and reduce the operating voltage of devices, the channel length of a gate of the device and the thickness of the oxide layer must be decreased. The gate width of the devices has been reduced from the past micro scale ($10^{-6}$ m) to the present nano scale ($10^{-9}$ m).

However, the miniaturization of the devices causes many problems, such as a stress-induced leakage current (SILC) and the shortened gate width causes a more serious short channel effect. To avoid the devices from being affected by the short channel effect, the thickness of the oxide layer becomes increasingly thinner. However, when the thickness of the oxide layer is reduced to 8 nm or below, the physical limitation of the materials becomes an obstacle of the device manufacturing process.

The stress-induced leakage current (SILC) is a gate leakage current increased after a constant voltage or a constant current is applied. After the thickness of the oxide layer is reduced, the stress-induced leakage current (SILC) becomes an important issue and the increase of the leakage current may cause a loss of electrons stored in a floating gate, so that the data preservation will be weakened, and the power consumption of the MOS device will be increased. In addition, the gate disturb and drain disturb of a memory bit also limit the thickness of the oxide layer significantly during the miniaturization process of the devices. Therefore, after the size of the device has reached the physical limit, there is an urgent need for overcoming the problems caused by the miniaturization of the device, in addition to the method of reducing the size of the devices.

SUMMARY

It is a primary objective of the present invention to provide a manufacturing method to provide a better stress transmission and improve the carrier mobility.

To achieve the aforementioned and other objectives, the present invention provides a manufacturing method of a flash memory structure with a stress area comprising the steps of: providing a silicon substrate; forming two gate structures on the silicon substrate, wherein each gate structure comprises a tunneling oxide layer, a floating gate, a dielectric layer and a control gate sequentially disposed on the silicon substrate, and the tunneling oxide layer is formed and deposited at 750° C.~800° C. and processed with a thermal annealing process at 750° C.~800° C.; comprehensively depositing a first oxide layer, a second oxide layer and a third oxide layer sequentially; etching to expose the top of the two gate structures; removing the third oxide layer between the two gate structures; forming a metal silicide layer on each of the two gate structures; comprehensively depositing a contact etch stop layer; and performing an anisotropic etching to expose the silicon substrate disposed between the two gate structures, such that the second oxide layer becomes an L-shaped spacer aligned towards one another and disposed between the two gate structures to form a first stress area, and a contact etch stop layer on each L-shaped spacer become a second stress area.

In a preferred embodiment, the thermal annealing process is performed for 10~60 minutes.

In a preferred embodiment, the tunneling oxide layer is deposited to a thickness with a range of 8.5 nm~10 nm.

In a preferred embodiment, the second oxide layer is formed at 400° C.~800° C. and deposited to a thickness within a range of 10 nm~40 nm. The contact etch stop layer is formed at 400° C.~600° C. and deposited to a thickness within a range of 10 nm~50 nm.

In a preferred embodiment, the contact etch stop layer is made of silicon nitride, silicon oxynitride or silicon oxide. The first oxide layer, the second oxide layer and the third oxide layer are made of a material selected from the collection of silicon nitride, silicon oxynitride and silicon oxide.

A better stress effect can be achieved by controlling the manufacturing process of a tunneling oxide layer formed in a gate structure and contacted with a silicon substrate, so that an L-shaped spacer (or a first stress area) and a contact etch stop layer (or a second stress area) of each L-shaped spacer are formed between two gate structures and aligned towards each other to enhance the carrier mobility of the gate structure, so as to achieve the effects of improving a read current, obtaining the required read current by using a lower read voltage, reducing the possibility of having a stress-induced leakage current (SILC), and enhancing the data preservation of the flash memory.

BRIEF DESCRIPTION

Figure 2:
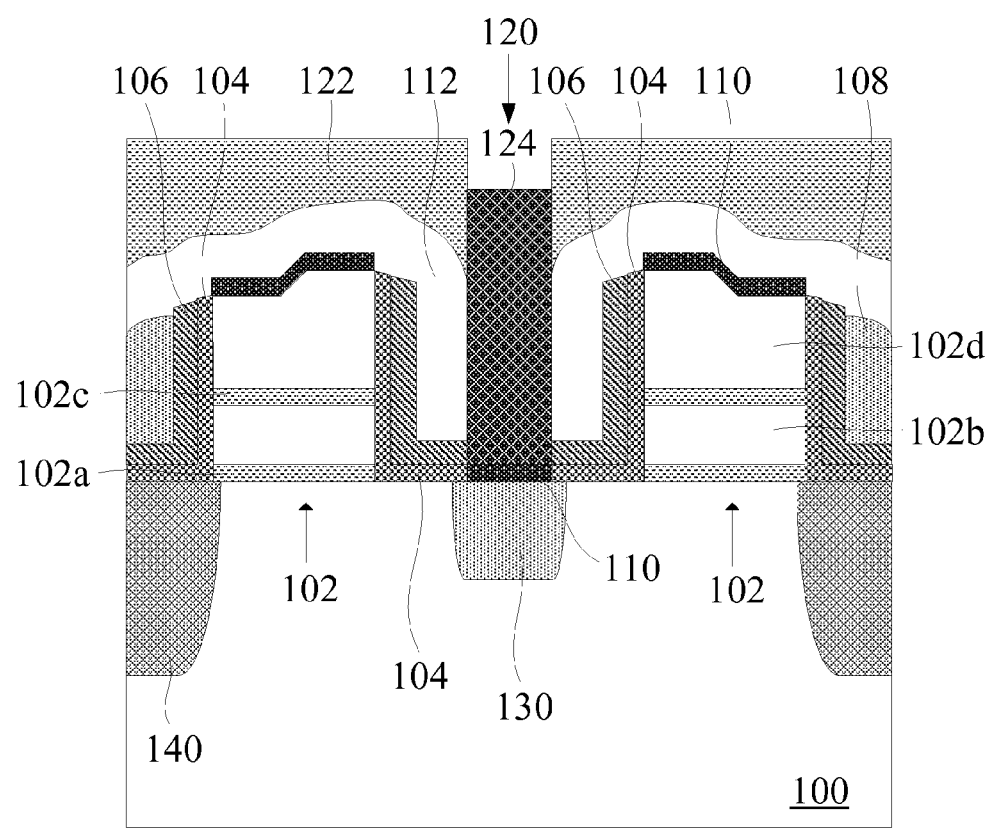

FIG. 1 is a flow chart of a manufacturing method of a flash memory structure with a stress area in accordance with a preferred embodiment of the present invention; and FIG. 2 is a schematic view of a flash memory structure with a stress area manufacturing by the method as depicted in FIG. 1.

DETAILED DESCRIPTION

The objects, characteristics and effects of the present invention will become apparent with the detailed description of the preferred embodiments and the illustration of related drawings as follows.

With reference to FIG. 1 for a flow chart of a manufacturing method of a flash memory structure with a stress area in accordance with a preferred embodiment of the present invention, the present invention adopts a specific manufacturing method to provide a stress area with a better operation effect, and the remaining doped areas are identical to the prior art, and thus will not be described. With reference to FIG. 2 for a schematic view of a flash memory structure with a stress area manufacturing by the method as depicted in FIG. 1, the manufacturing method of a flash memory unit comprises the following steps.

S101: Provide a silicon substrate 100.

S103: Form two gate structures 102 on the silicon substrate 100. Wherein, each gate structure 102 comprises a tunneling oxide layer 102a, a floating gate 102b, a dielectric layer 102c and a control gate 102d sequentially formed on the silicon substrate 100. In particular, the tunneling oxide layer 102a is deposited and formed at 750° C.~800° C. and processed by a thermal annealing process at 750° C.~800° C. In a preferred embodiment, the thermal annealing process is performed continuously for 10~60 minutes, and the tunneling oxide layer 102a is preferably deposited to a thickness of 8.5 (nm) ~10 (nm).

In this preferred embodiment, the tunneling oxide layer 102a can be formed by a thermal oxidation or a rapid-thermal oxidation at 750° C.~800° C.

The dielectric layer 102c is formed on the floating gate 102b. Wherein, the dielectric layer 102c is generally made of silicon oxide/nitride/dioxide (ONO) and formed by sequentially depositing first-layer silicon dioxide, silicon nitride and second-layer silicon dioxide.

S105: Comprehensively and sequentially deposit a first oxide layer 104, a second oxide layer 106 and a third oxide layer 108, wherein the oxide layers 104, 106, 108 are filled between two gate structures 102 to form a recessed portion. The oxide layers 104, 106, 108 can be made of silicon nitride, silicon oxynitride or silicon oxide. Preferably, the second oxide layer (which is an L-shaped spacer or a first stress area formed at a later stage) is formed at 400° C.~800° C. and deposited to a thickness of 10~40 nm.

S107: Perform an etching process to etch till the top of the two gate structures 102 is exposed.

S109: Remove the third oxide layer 108 from the recessed portion between the two gate structures 102.

S111: Form a metal silicide layer 110 on each of the two gate structures 102.

S113: Comprehensively deposit a contact etch stop layer 112, wherein the contact etch stop layer 112 can be made of silicon nitride, silicon oxynitride or silicon oxide. Preferably, the contact etch stop layer (which is a second stress area formed at a later stage) is formed at 400° C.~600° C. and deposited to a thickness of 10~50 nm.

S115: Perform an anisotropic etching to form a contact 120 to expose the silicon substrate 100 in the recessed portion between the two gate structures 102. Such etching can form the L-shaped spacers aligned towards one another, and in the recessed portion between the two gate structures 102, and on the second oxide layer 106 as shown in FIG. 2, and the L-shaped spacers are symmetrically on the left and right sides, and the two L-shaped spacers become the first stress area. In the meantime, the etching also forms two portions on the left and right sides respectively in the recessed portion between the two gate structures 102 of the contact etch stop layer 112 on each L-shaped spacer, and a portion of the contact etch stop layer 112 on each first stress area becomes the second stress area.

Therefore, the tunneling oxide layer 102a manufactured by the specific manufacturing process with the first stress area and the second stress area can provide a better stress effect, so that the L-shaped spacers (or the first stress area) aligned towards one another and between the two gate structures and the contact etch stop layer (second stress area) on each L-shaped spacer can achieve the effects of enhancing the carrier mobility in the gate structure, improving the read current, obtaining the required read current by using a lower read voltage, reducing the possibility of having a stress-induced leakage current, and enhancing the data preservation of the flash memory.

In FIG. 2, a drain area 130 and a source area 140 doped in the silicon substrate 100 are formed by additional steps of the aforementioned procedure. For example, the source area 140 is formed by performing an ion implant by using the two gate structures 102 as a mask after the two gate structures 102 are formed, and the drain area 130 is formed by performing an ion implant by using the contact etch stop layer 112 as a mask after the step S114 takes place.

In FIG. 2, a dielectric layer 122 and a potential barrier plug are formed between the layers after the step S115 takes place. However, these are prior arts, and will not be described here.

While the invention has been described by means of specific embodiments, numerous modifications and variations could be made thereto by those skilled in the art without departing from the scope and spirit of the invention set forth in the claims.

What is claimed is:

1. A manufacturing method of a flash memory structure with a stress area, comprising the steps of:
    providing a silicon substrate;
    forming two gate structures on the silicon substrate, wherein each of the two gate structure comprises a tunneling oxide layer, a floating gate, a dielectric layer and a control gate sequentially disposed on the silicon substrate, and the tunneling oxide layer is formed and deposited at 750° C.~800° C. and processed with a thermal annealing process at 750° C.~800° C.;
    comprehensively depositing a first oxide layer, a second oxide layer and a third oxide layer sequentially;
    etching to expose a top of the two gate structures;
    removing the third oxide layer between the two gate structures;
    forming a metal silicide layer on each of the two gate structures;
    comprehensively depositing a contact etch stop layer; and
    performing an anisotropic etching to expose the silicon substrate disposed between the two gate structures, such that the second oxide layer becomes an L-shaped spacer aligned towards one another and disposed between the two gate structures to form a first stress area, and a contact etch stop layer on each L-shaped spacer become a second stress area.

2. The manufacturing method of claim 1, wherein the thermal annealing process is performed for 10~60 minutes.

3. The manufacturing method of claim 1, wherein the tunneling oxide layer is deposited to a thickness with a range of 8.5 nm~10 nm.

4. The manufacturing method of claim 1, wherein the second oxide layer is formed at 400° C.~800° C. and deposited to a thickness within a range of 10 nm~40 nm.

5. The manufacturing method of claim 1, wherein the contact etch stop layer is formed at 400° C.~600° C. and deposited to a thickness within a range of 10 nm~50 nm.

6. The manufacturing method of claim 1, wherein the contact etch stop layer is made of a material selected from the collection of silicon nitride, silicon oxynitride and silicon oxide.

7. The manufacturing method of claim 1, wherein the first oxide layer, the second oxide layer and the third oxide layer are made of a material selected from the collection of silicon nitride, silicon oxynitride and silicon oxide.

* * * * *